(12) United States Patent
Chiu et al.

(10) Patent No.: US 6,593,644 B2
(45) Date of Patent: Jul. 15, 2003

(54) SYSTEM OF A PACKAGE FABRICATED ON A SEMICONDUCTOR OR DIELECTRIC WAFER WITH WIRING ON ONE FACE, VIAS EXTENDING THROUGH THE WAFER, AND EXTERNAL CONNECTIONS ON THE OPPOSING FACE

(75) Inventors: George Liang-Tai Chiu, Cross River, NY (US); John Harold Magerlein, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 09/838,725

(22) Filed: Apr. 19, 2001

(65) Prior Publication Data

US 2002/0153603 A1 Oct. 24, 2002

(51) Int. Cl.⁷ .............................................. H01L 23/492
(52) U.S. Cl. ....................... 257/684; 257/693; 257/723; 438/108; 438/125; 438/459
(58) Field of Search ................................. 438/108, 125, 438/459; 257/684, 693, 723

(56) References Cited

U.S. PATENT DOCUMENTS

| | | | | |
|---|---|---|---|---|
| 4,811,082 A | * | 3/1989 | Jacobs et al. ................. 357/80 |
| 5,258,648 A | * | 11/1993 | Lin .............................. 257/778 |
| 6,025,638 A | | 2/2000 | Pogge et al. ................. 257/618 |
| 6,229,216 B1 | * | 5/2001 | Ma et al. ..................... 257/777 |
| 6,281,042 B1 | * | 8/2001 | Ahn et al. ................... 438/108 |
| 2002/0081838 A1 | * | 6/2002 | Bohr .......................... 438/637 |

OTHER PUBLICATIONS

Stanley Wolf, "Silicon Processing for the VLSI Era—vol. 2: Process Integration," Lattice Press, Sunset Beach, California, 1990, pp. 192–194.*

Stanley Wolf and Richard N. Tauber, "Silicon Processing for the VLSI Era—vol. 1:Process Technology," Lattice Press, Sunset Beach, California, 1986, pp. 198.*

Matsude et al, "Silicon Interposer Technology for High Density Package", Proceedings of the 50th IEEE Electronics and Technology Conference, 2000, pp. 1455–1459.

* cited by examiner

Primary Examiner—Carl Whitehead, Jr.
Assistant Examiner—Stephen W. Smoot
(74) Attorney, Agent, or Firm—Daniel P. Morris; Alvin J. Riddles

(57) ABSTRACT

A semiconductor or dielectric wafer with conducting vias is used as a substrate in an integrated circuit packaging structure, where high density inter and intra chip contacts and wiring are positioned on the substrate face on which the integrated circuitry is mounted, and external signal and power circuitry is contacted through the opposite face. Use of a substrate such as silicon permits the use of conventional silicon processes available in the art for providing high wiring density together with matching of the thermal expansion coefficient of any silicon chips in the integrated circuits. The use of vias through the substrate allows a high density of connections leaving the silicon substrate and provides short paths for the connections of power and signals.

15 Claims, 2 Drawing Sheets

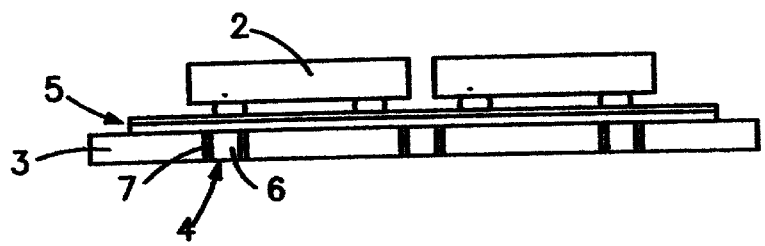
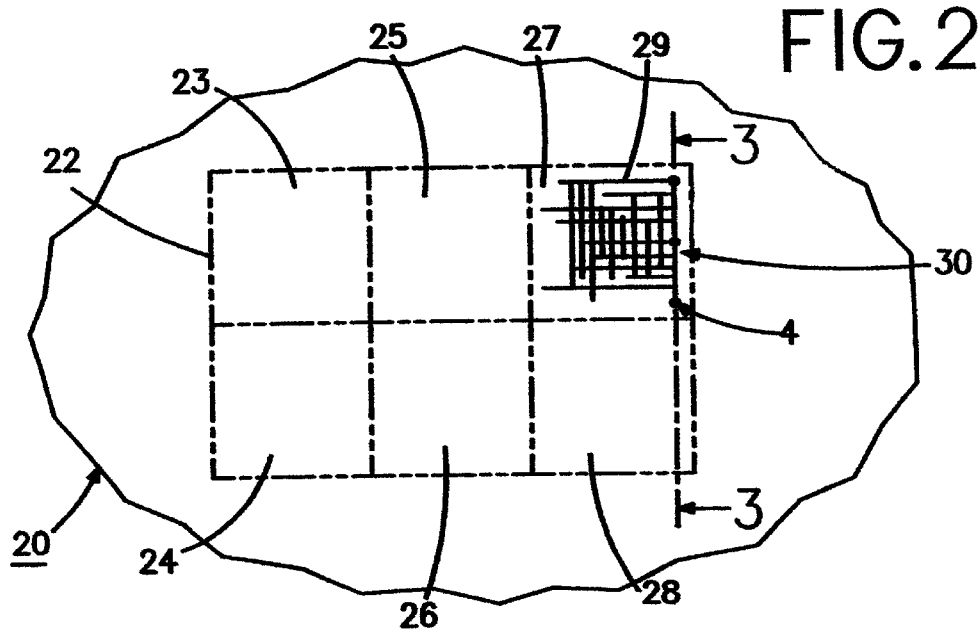
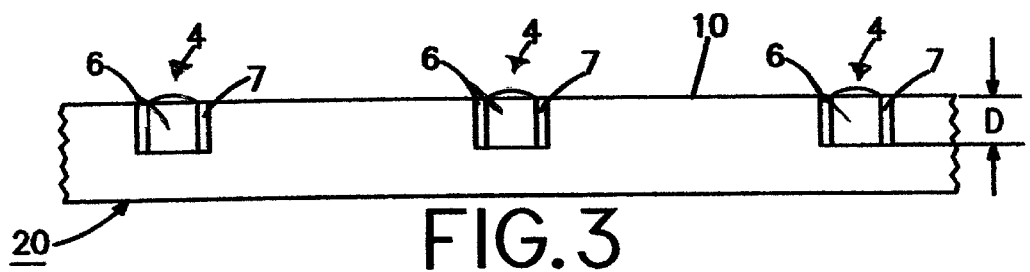
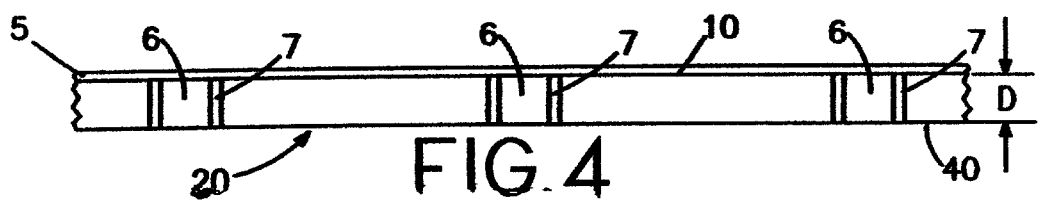

SYSTEM OF A PACKAGE FABRICATED ON A SEMICONDUCTOR OR DIELECTRIC WAFER WITH WIRING ON ONE FACE, VIAS EXTENDING THROUGH THE WAFER, AND EXTERNAL CONNECTIONS ON THE OPPOSING FACE

FIELD OF THE INVENTION

This invention relates to the concept and the fabrication of a multi chip electronic module having a high density of interconnects and fabricated using integrated circuit processes on semiconductor or dielectric wafers. Such a package of individual integrated circuit and other elements, which may be described as a system on a package, can offer technical and economic advantages compared to a single fully integrated chip or to a conventional multi chip module.

BACKGROUND OF THE INVENTION

In the assembly of integrated semiconductor circuit elements such as integrated circuit chips and other passive and active electrical components into a complete unit, these elements are typically mounted in an electronic package which provides for interconnection among the elements. Electronic packages typically provide a much lower density of interconnection and wiring than is available within an integrated circuit chip. Thus as many diverse functions as possible are often combined within single integrated circuit chips in order to make use of the dense multi layer chip wiring to maximize the functionality and performance of the complete unit. As the function performed by the unit increases in complexity, the chip size typically increases.

As the size of an integrated circuit chip becomes larger, the yield of satisfactory chips in a typical manufacturing process decreases exponential and the cost of the chip increases beyond acceptable limits. Furthermore, the diverse parts of the chip must all be fabricated using the same fabrication process, typically leading to difficult compromises. For example, combining logic and memory circuits on the same chip with a compromise process degrades logic performance and memory density compared to using the optimal process technology for each type of circuit. Integrating many diverse functions on a single chip also greatly increases design time. These problems can be avoided by using a number of smaller chips connected together in an electronic package, but performance may be degraded due to the lower interconnection capability of typical packages.

There has been some effort in the art, as illustrated in U.S. Pat. No. 6,025,638 to develop electronic packaging which provides a greater density of interconnects. This approach employs a complex fabrication process which uses materials and processes which are not typically practiced as part of semiconductor chip or package fabrication.

In addition to the considerations of chip size and partitioning, there also considerations in choosing electronic package materials and processes which are commonly practiced, well characterized, inexpensive, and simple. Some insight into such considerations are discussed in a publication titled "Silicon Interposer Technology For High-Density Package" by Matsuo et al., in the Proceedings of the 50th IEEE Electronic Components and Technology Conference, 2000, pages 1455–1459; wherein the use of a silicon interposer attached to a single chip is advanced.

There are clear needs in the art for an electronic packaging capability that will operate to provide a high interconnect and wiring density between chips and which will allow the package to be fabricated using a simple technique involving commonly available fabrication processes and tools.

SUMMARY OF THE INVENTION

In the invention, a wafer of a semiconductor such as silicon or a dileetno such as glass is used as an electronic module package substrate. Conducting vias through the wafer and high density, inter and intra, chip contacts and wiring, are fabricated using conventional silicon wafer processing tools and processes available in the mt. The substrate may be chosen to have a similar thermal expansion coefficient as that of the chips mounted thereon. The use of vias through the substrate provides for a high density of connections exiting to the next level of packaging hierarchy, allows short paths for power and signals and improves power and ground distribution.

BRIEF DESCRIPTION OF THE DRAWINGS

FIG. 1 is a cross sectional depiction of the package of the invention, illustrating a module with vias and surface circuitry, supporting two integrated circuit chips.

FIG. 2 is a top view of a wafer in the process of becoming a set of module substrates with an example layout of modules, wiring and via locations.

FIG. 3 is a cross sectional depiction of the wafer of FIG. 2 partially along the line 3—3, illustrating the partial formation of vias to a depth "D".

FIG. 4 is a cross sectional depiction of a further partial product of the portion of a FIG. 3 wafer, illustrating wiring pattern, via connection and electrical isolation features.

DESCRIPTION OF THE INVENTION

Figure 5:
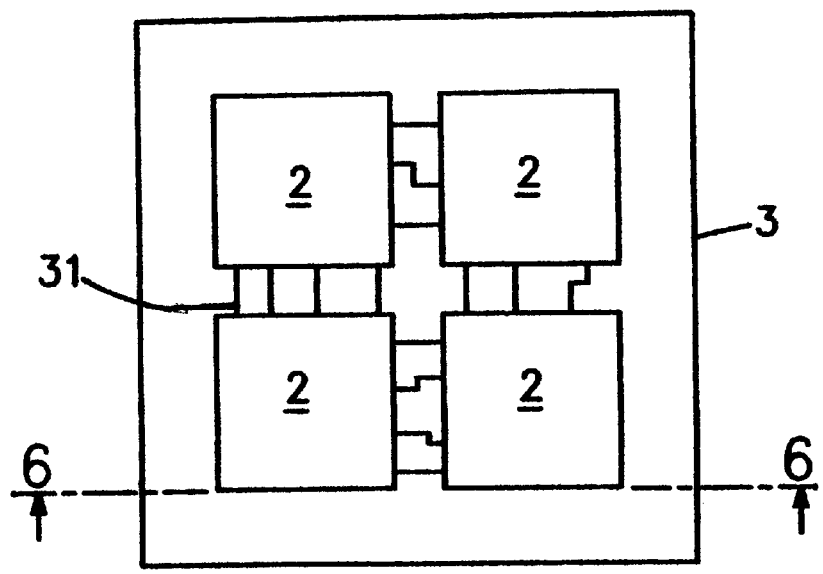
FIG. 5 is a top view of a four integrated circuit module that has been diced along the dotted lines of FIG. 2.

The invention provides an electronic package with a semiconductor or dielectric substrate electrically isolated conducting vias from one face to the other and with high density conducting wiring and contacts on one or both surfaces.

For clarity and simplicity of explanation, the description will be focused around the material silicon for both the substrate and for the processes employed.

Low conductivity silicon in wafer form is a satisfactory material for the substrate. High density can be readily fabricated on such a substrate using processes which are well developed for the fabrication of integrated circuit wiring. In addition substrates of this material may be chosen to have a thermal expansion coefficient matching that of integrated circuit elements so as to minimize thermal stresses between chips and the silicon package module. The use of conducting vias through the substrate allows a high density of connections and provides short paths for the connection of power and signals, thus improving the electrical performance of the package.

Referring to FIG. 1 wherein there is shown a cross sectional depiction of the module of the invention consisting of integrated circuits 2, of which two are shown, attached to a substrate 3 of silicon, that in turn has vias 4 and surface circuitry 5. The vias 4, of which three are shown, each consist of a conducting member 6 which may optionally be surrounded by an electrically insulating layer 7, such as would occur by oxidation of the walls of the via hole through the silicon substrate 3 prior to filling with conducting material forming the conducting member 6. In the event that the substrate 3 were to be of a dielectric such as glass the providing of an electrical insulating layer around the via would not be needed The vias 4 are distributed throughout the area of the substrate 3 so as to provide short length external electrical connections to the surface circuitry 5. The circuitry 5, which may have multiple layers of conductors and insulation, provides wiring with a density comparable to that on integrated circuits and much greater than is typically found on electronic packages. The circuitry 5 provides for the intra chip, the inter chip and the external connections of the package.

The substrate member 3 may be fabricated as a portion of a larger wafer as shown in FIG. 2. FIG. 2 is a top view of a silicon wafer in the process of becoming a set of packaging substrates with an example layout of modules, wiring and via locations. FIGS. 3 and 4 show partial depictions of the wafer of FIG. 2 along the line 3—3. FIG. 3 depicts the wafer after the etching, isolation and the filling of the vias to a depth D. FIG. 4 depicts the wafer at a later stage of processing, following the formation of the surface wiring pattern and the thinning of the wafer to expose the back of the vias that extend through the wafer.

Referring to FIG. 2, a wafer 20, which could be cut from a grown crystalline boule, is laid out into module substrates 23–28 defined by dotted lines 22. A future dicing operation along dotted lines 22 is employed to separate the modules. High density wiring and interconnection processes are employed to produce personalized wiring 29 for each of the areas 23–28, only the wiring for module 27 being shown. Connections from the personalized wiring to the integrated circuit chips are generally labelled as element 30.

Referring to FIG. 3, which is a partial cross sectional depiction along the line 3—3 of FIG. 2, the vias are etched to a depth D. The depth of the etch may be the full thickness of the wafer or may be less, as depicted here. The etch depth D operates to establish the final thickness of the substrate. The etched holes may optionally be provided with electrical isolation such as would occur on silicon by growing an oxide lining 7. The hole 4 is then filled with conductor metal 6 which may protrude above the surface 10 and which may be brought flush with the surface 10 with a chemical mechanical polish.

Referring to FIG. 4, which is a further cross sectional depiction, high density wiring 5 has been fabricated on the surface of the wafer. This wiring, which may consist of one or more metal levels with necessary dielrictric levels and vias, may contact the metal 6 in the substrate vies. Further, the lower surface 40 of the wafer 20 has been eroded away using such techniques as grinding or chemical mechanical polishing to the dimension D from the surface 10, exposing the bottom of the vias 4 with the metal filling 6. Ball metal contacting may now be employed in making external connections to the metal fillings 6 in the surface 40.

Figure 6:
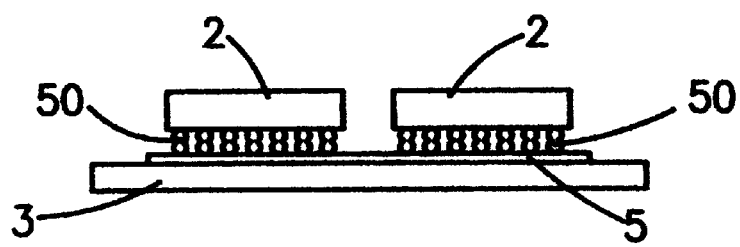
FIG. 6 is a cross sectional view along the line 6—6 of FIG. 5 of the module in FIG. 5 showing the chips positioned on the substrate, the chip attachment contacts, the inter and intra, module wiring and the vias.
Figure 7:
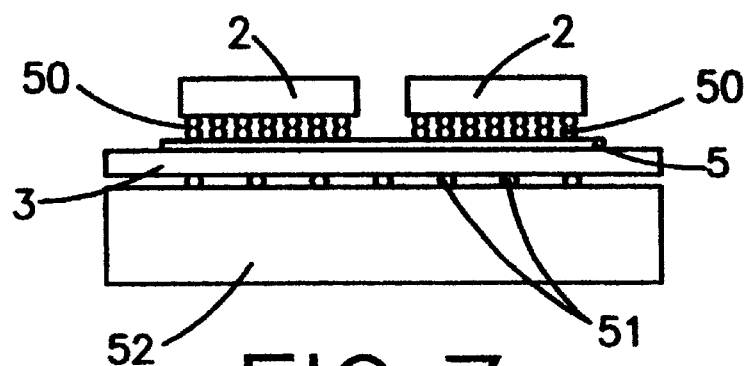
FIG. 7 is a cross sectional view of the module as in FIG. 6 after mounting to an external package substrate using ball contacts.

In accordance with the invention, wiring in the module may form connections within and between integrated circuits and other components mounted thereon so as to assemble functional circuitry, up through a complete system. Referring to FIGS. 5–7 using the same reference numerals for like elements from previous figures, an illustration is advanced in FIG. 5 of a top view of a four integrated circuit module such as 27 of FIG. 2, with inter chip wiring 31, that has been diced along lines 22 out of a wafer such as 20 of FIG. 2. FIG. 6 is a cross sectional view along the line 6—6 of FIG. 5 of the module such as 27 in FIG. 2 showing four chips such as 2 of FIG. 1, connected using connections 50 of the high density damascene type well known in the art to the high density wiring 5 on the substrate 3. Further continuing, in FIG. 7 the ball contacts 51 of which seven are shown, provide external contact to outside type circuitry such as printed circuit element 52.

As an illustration of the considerations that become involved in the practice of the invention the following examples are provided correlated with the reference numerals of the drawings. A wafer of silicon with low electrical conductivity is used as the substrate 3. Holes 4, to become vias are etched into the substrate wafer 3 through an etch mask on the upper surface 10, to a depth D sufficient to leave enough material for physical support in fabrication and service after the lower surface 40 of the wafer is removed using a process such as grinding or chemical-mechanical polishing. Etching may be done at high rates of about 5–30 micrometers per minute, so as to achieve a practical process time. Once the holes 4 are formed, the sidewalls may be oxidized 7 or lined with a material such as silicon nitride, tantalum and tantalum nitride, to provide electrical isolation and a diffusion barrier if these are required for a particular application. The openings are then filled with a metal 6 such as copper, nickel and aluminum. Vias at 25–50 micrometer diameter are routine. Chemical-mechanical polishing is employed at the surface 10 to insure planarization around the vias.

The high density wing 5 is fabricated on the surface 10. The circuitry 5 may have multiple interconnected layers fabricated using techniques which are known in the art of semiconductor chip fabrication. The circuitry 5 may involve both inter chip wiring as illustrated by element 31 in FIG. 5 and intra chip wiring as illustrated by element 29 in FIG. 2. Chip attachment contacts may be made with such techniques as solder technology and diffusion bonding.

The silicon wafer may then be thinned as illustrated in FIG. 4, to establish the dimension D the filled 6, isolated 7 vias 4 in the surface 40. The thinning step can be performed earlier in the process. The ball type 51 metallurgy well known in the art is used to make contact to an external wiring member 52. The ball metallurgy permits contacting with a simple temperature excursion and dwell and is well within the usual process windows. Contacts may be made on the surface of the wiring 5 to specific contacts of the 50 type where needed. The wafer may be then diced into modules along the lines 22 of FIG. 2.

The use of a silicon substrate with conductive vias offers several advantages compared to other packages known in the art. The well established techniques for fabricating on silicon wafers allows for the easy fabrication of a much higher density of wiring than is achieved on other substrates. Silicon has a high thermal conductivity and its thermal expansion coefficient matches that of silicon based integrated circuits which may be mounted thereon. The vias are selectable in location throughout the module area, which is an advantageous power and signal distribution arrangement, and further there is flexibility on chip size, wiring configuration, and fabrication process.

What has been described is an electronic package with a supporting substrate consisting of a wafer of silicon or other suitable semiconductor or dielectric having conducting vias and high density inter and intra chip contacts and wiring on the substrate face on which the integrated circuitry is mounted and there is connection to less dense higher power output circuitry through the opposite face.

What is claimed is:

1. In an integrated circuit package wherein components, including integrated circuit members, are interconnected into a functional unit and then further connected into power and signal external circuitry, the improvement comprising:

a substrate member of a material taken from the group of semiconductor and dielectric, said substrate member having first and second essentially parallel faces, said substrate member having high density inter and intra integrated circuit member wiring positioned on said first of said first and second essentially parallel faces, said substrate member further having at least one via member extending through said substrate member from said first to said second of said essentially parallel faces, at least one of said components including at least one of said integrated circuit elements being positioned on said first of said first and second parallel faces of said substrate member, with said inter and intra integrated circuit member wiring, including said at least one via member connected through said high density inter and intra integrated circuit member wiring, and, at least one external density circuit connection positioned on said second of said first and second parallel faces and connected to said at least one said via member.

2. The improvement of claim 1, wherein said substrate member and at least one of said integrated circuit members have a matching specific temperature coefficient of expansion.

3. The improvement of claim 1 wherein said at least one external density circuit connection positioned on said second of said first and second parallel faces and connected to at least one said via member involves ball metallurgy.

4. The improvement of claim 1 wherein said via members are of at least one of copper, nickel and aluminum.

5. The method of interconnecting integrated circuit members into a functional circuit unit and then further connecting said unitinto power and signal external circuitry, comprising the steps of:

providing a substrate member having first and second essentially parallel faces separated by a first thickness dimension, forming a pattern of holes for vias in said first face of said substrate to a depth that is less than said first thickness dimension, filling said via holes with a conductor material, planarizing said first face of said substrate including said filled vias, applying high density circuitry on said first face of said substrate, said applying step serially including providing contacts into said circuitry from said vias on said first face of said substrate, and, providing contacts in the exposed surface of said high density circuitry for connections to said integrated circuit members, removing material from said second face of said substrate thereby exposing said conductor filled vias, positioning on and contacting into said high density circuitry, each of said at least one integrated circuit members and, contacting each said exposed vias in said second face of said substrate into external power and signal circuitry.

6. The interconnecting method of claim 5 wherein the material of said substrate is silicon.

7. The interconnecting method of claim 6 including the step of providing a layer of isolation on the walls of said via holes before the step of filling said via holes with conductor material.

8. The interconnecting method of claim 7 wherein said isolation layer is a material taken from the group of silicon oxide, silicon nitride, tantalum and tantalum nitride.

9. The interconnecting method of claim 6 wherein said vias are filled with at least one metal taken from the group of copper, nickel and aluminum.

10. The interconnecting method of claim 6 wherein said contacting into power and signal external circuitry involves ball metallurgical contacts.

11. In interconnecting integrated circuit elements with each other and into power and external circuitry, the packaging method comprising the steps of:

providing a substrate member said substrate member having first and second essentially parallel faces, said substrate having a pattern of conductor filled vias each exposed on said first and said second faces, applying at least one layer of high density circuitry on the first of said first and second faces of said substrate with connections to said exposed vias, positioning said integrated circuit elements on and connecting into said high density circuitry on said first face of said substrate, and, applying a contact to each said exposed via on said second of said faces of said substrate into power and signal external circuitry.

12. The interconnecting method of claim 11 including in said step of providing a pattern of conductor filled vias each exposed on said first and said second substrate faces, the providing of electrical isolation at each via.

13. The interconnecting method of claim 12 wherein said substrate is of silicon.

14. The interconnecting method of claim 13 wherein said electrical isolation is oxidation on the walls of said via holes prior to filling with metal.

15. The interconnecting method of claim 14 wherein said applying contacts into power and signal external circuitry involves ball metallurgy.

* * * * *